(12) United States Patent
Arp et al.

(10) Patent No.: US 11,025,239 B2
(45) Date of Patent: *Jun. 1, 2021

(54) STATIC COMPENSATION OF AN ACTIVE CLOCK EDGE SHIFT FOR A DUTY CYCLE CORRECTION CIRCUIT

(71) Applicant: International Business Machines Corporation, Armonk, NY (US)

(72) Inventors: Andreas H. A. Arp, Nufringen (DE); Fatih Cilek, Boeblingen (DE); Michael V. Koch, Ehningen (DE); Matthias Ringe, Tuebingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/421,897

(22) Filed: May 24, 2019

(65) Prior Publication Data

US 2019/0280683 A1    Sep. 12, 2019

Related U.S. Application Data

(63) Continuation of application No. 15/855,039, filed on Dec. 27, 2017, now Pat. No. 10,361,689, which is a
(Continued)

(51) Int. Cl.
*H03K 3/017* (2006.01)
*H03K 5/04* (2006.01)
(Continued)

(52) U.S. Cl.
CPC ............. *H03K 5/1565* (2013.01); *G06F 1/04* (2013.01); *G06F 1/06* (2013.01); *G06F 1/12* (2013.01);
(Continued)

(58) Field of Classification Search
CPC ........ H03K 5/1565; H03K 7/08; H03K 3/017; H03K 5/151; H03L 7/0812
(Continued)

(56) References Cited

U.S. PATENT DOCUMENTS 7,705,647 B2    4/2010   Dai et al.
7,839,194 B2    11/2010  Chang et al.
(Continued)

OTHER PUBLICATIONS

Bogiarati, et al., "A 800 MHz-1.1 GHz 1.2 mW Delay Locked Loop with a Closed Loop Duty Cycle Corrector," Journal of Electrical and Electronic Systems, vol. 5, Issue 2, 2016, 3 pages, DOI. 10.4172/2332-0796.1000179.
(Continued)

*Primary Examiner* — Quan Tra
(74) *Attorney, Agent, or Firm* — Jared C. Chaney

(57) ABSTRACT

Duty cycle correction devices for static compensation of an active clock edge shift. A duty cycle correction circuit in the duty cycle correction device corrects a clock input signal, according to a first control signal. A programmable delay circuit or a modified duty cycle correction circuit in the duty cycle correction device compensates a shift of an active clock edge in a clock output signal of the duty cycle correction circuit, according to a second control signal. A mapping circuit in the duty cycle correction device generates the second control signal by mapping a digital value of the first control signal and a digital value of the second control signal.

12 Claims, 9 Drawing Sheets

Related U.S. Application Data continuation of application No. 15/713,738, filed on Sep. 25, 2017, now Pat. No. 10,622,981.

(51) Int. Cl.

| | | |
|---|---|---|
| *H03K 5/02* | (2006.01) | |
| *H03K 5/156* | (2006.01) | |
| *G06F 1/06* | (2006.01) | |
| *G06F 1/12* | (2006.01) | |
| *H03K 5/159* | (2006.01) | |
| *G06F 1/04* | (2006.01) | |
| *H03K 5/00* | (2006.01) | |

(52) U.S. Cl.
CPC ............. *H03K 3/017* (2013.01); *H03K 5/159* (2013.01); *H03K 2005/00254* (2013.01); *H03K 2005/00286* (2013.01)

(58) Field of Classification Search
USPC ................................................. 327/172, 175
See application file for complete search history.

(56) References Cited

U.S. PATENT DOCUMENTS

| | | | |
|---|---|---|---|
| 7,990,194 | B2 | 8/2011 | Shim |
| 8,018,261 | B2 | 9/2011 | Becker et al. |
| 8,373,462 | B2 * | 2/2013 | Ma .................... H03L 7/0812 327/147 |
| 8,513,997 | B2 | 8/2013 | Hesen et al. |
| 8,570,084 | B2 | 10/2013 | Lin |
| 8,803,576 | B2 | 8/2014 | Kitagawa |
| 9,048,823 | B2 | 6/2015 | Bui et al. |
| 9,413,347 | B1 | 8/2016 | Nien |
| 9,520,867 | B2 | 12/2016 | Lin |
| 10,063,222 | B1 | 8/2018 | Arp et al. |
| 2002/0070752 | A1 | 6/2002 | Harrison |
| 2002/0196883 | A1 | 12/2002 | Best et al. |
| 2008/0191767 | A1 | 8/2008 | Koo |
| 2008/0272815 | A1 | 11/2008 | Yeo et al. |
| 2010/0156487 | A1 | 6/2010 | Kim |
| 2010/0225372 | A1 | 9/2010 | Satoh et al. |
| 2011/0248752 | A1 | 10/2011 | Willey et al. |
| 2012/0019299 | A1 | 1/2012 | McLeod et al. |
| 2012/0223754 | A1 | 9/2012 | Lewis |
| 2013/0063191 | A1 | 3/2013 | Patil et al. |
| 2013/0154702 | A1 | 6/2013 | Kim et al. |
| 2014/0009197 | A1 | 1/2014 | Yasuda |
| 2014/0333361 | A1 | 11/2014 | Chau et al. |
| 2015/0002201 | A1 | 1/2015 | Kitagawa et al. |
| 2015/0171834 | A1 | 6/2015 | Arp et al. |
| 2015/0200655 | A1 | 7/2015 | Kang et al. |
| 2015/0341021 | A1 | 11/2015 | Ma |
| 2015/0364176 | A1 | 12/2015 | Lee |
| 2016/0013785 | A1 | 1/2016 | Nakata |
| 2016/0094205 | A1 | 3/2016 | Aremallapur |
| 2017/0033746 | A1 | 2/2017 | Lam et al. |
| 2017/0040986 | A1 | 2/2017 | Ma |
| 2017/0093386 | A1 | 3/2017 | Kitagawa |
| 2017/0111033 | A1 | 4/2017 | Chae et al. |

OTHER PUBLICATIONS

Arp et al., "Dynamic Control of Edge Shift for Duty Cycle Correction", U.S. Appl. No. 15/714,438, filed Sep. 25, 2017.

Arp et al., "Static Compensation of an Active Clock Edge Shift for a Duty Cycle Correction Circuit," U.S. Appl. No. 15/713,738, filed Sep. 25, 2017.

List of IBM Patents and Patent Applications Treated as Related, Dated May 22, 2019, 2 pages.

Chung et al., "A wide-range all-digital duty-cycle corrector with output clock phase alignment in 65 nm CMOS technology," IEICE Electronics Express, vol. 8, No. 15, 2011, 7 pages.

Nam, "An All-Digital CMOS Duty Cycle Correction Circuit with a Duty-Cycle Correction Range of 15-to-85% for Multi-Phase Applications", IEICE Transactions on Electronics, vol. E88-C, No. 4 Apr. 2005, pp. 773-777.

Wang, et al. "A Compact Delay-Recycled Clock Skew-Compensation and/or Duty-Cycle-Correction Circuit", SOC Conference (SOCC) 2011 IEEE International, Sep. 26-28, 2011, 9 Pages.

Koch et al., "Correcting Duty Cycle3 and Compensating for Active Clock Edge Shift," U.S. Appl. No. 15/714,012, filed Sep. 25, 2017.

Arp et al., "Dynamic Control of Edge Shift for Duty Cycle Correction", U.S. Appl. No. 15/854,985, filed Dec. 27, 2017.

Koch et al., "Correcting Duty Cycle and Compensating for Active Clock Edge Shift," U.S. Appl. No. 15/854,961, filed Dec. 27, 2017.

Arp et al., "Static Compensation of an Active Clock Edge Shift for a Duty Cycle Correction Circuit," U.S. Appl. No. 15/855,039, filed Dec. 27, 2017.

* cited by examiner

STATIC COMPENSATION OF AN ACTIVE CLOCK EDGE SHIFT FOR A DUTY CYCLE CORRECTION CIRCUIT

BACKGROUND

The present invention relates generally to a duty cycle correction device, and more particularly to static compensation of an active clock edge shift for a duty cycle correction circuit.

Designing digital circuits requires a clear design of signal timing and the right sequence of signals dependent from each other. Special focus is often on investigating timing behavior, especially, on waveforms of critical signals, like clock signals. In complex chip designs, clock signals often run across multiple clock trees and clock meshes to different physical areas of a semiconductor die. In particular, rising and falling edges of signals require special attention. Getting this timing behavior of these critical signals of integrated circuits right is paramount for the functionality and reliability of VLSI (very large-scale integrated circuit) chips. Besides the signal waveform in general, the duty cycle is a relevant figure of merit and has to be monitored and potentially adapted for meeting design requirements. For the duty cycle of signals, in particular clock signals, only a small variability may be acceptable. The clock signal(s) may be deformed by running through the clock trees and clock meshes. Thus, a "re-establishment" of the predefined duty cycle may be required.

To correct or change the duty cycle of signals, DCC (duty cycle correction) circuits are used. Typical DCC circuits receive an input signal as well as a configuration or control signal defining the desired duty cycle characteristics, in particular, the percentage of time the signal has the logical value "0" as well as the percentage of time the signal has the logical value of "1" within one cycle. In an ideal case, the DCC moves only the inactive clock edge of the signal or clock signal. However, due to the limitations of real electronic circuits which do not behave like ideal circuits, it appears that both edges, active and inactive, may be impacted.

SUMMARY

A duty cycle correction device for static compensation of an active clock edge shift is provided. The duty cycle correction device comprises a duty cycle correction circuit configured to correct, according to a first control signal, a clock input signal. The duty cycle correction device further comprises a programmable delay circuit configured to compensate, according to a second control signal, a shift of an active clock edge in a clock output signal of the duty cycle correction circuit. The duty cycle correction device further comprises a mapping circuit configured to generate the second control signal by mapping a digital value of the first control signal and a digital value of the second control signal.

A duty cycle correction device for static compensation of an active clock edge shift is provided. The duty cycle correction device comprises a duty cycle correction circuit configured to correct, according to a first control signal, a clock input signal. The duty cycle correction device further comprises a modified duty cycle correction circuit configured to compensate, according to a second control signal, a shift of an active clock edge in a clock output signal of the duty cycle correction circuit. The duty cycle correction device further comprises a mapping circuit configured to generate the second control signal by mapping a digital value of the first control signal and a digital value of the second control signal.

A method for static compensation of an active clock edge shift is provided. The method comprises correcting, by a duty cycle correction circuit in a duty cycle correction device, according to a first control signal. The method further comprises compensating, by a programmable delay circuit in the duty cycle correction device, a shift of an active clock edge in a clock output signal of the duty cycle correction circuit, according to a second control signal. The method further comprises generating, by a mapping circuit in the duty cycle correction device, the second control signal by mapping a digital value of the first control signal and a digital value of the second control signal.

DETAILED DESCRIPTION

In the context of this description, the following conventions, terms and/or expressions may be used.

The term "duty cycle correction device" may denote a device implemented as a portion of a semiconductor chip operable to correct a duty cycle of a signal. Typically, the signal may be a clock signal which may be degenerated when passing through a clock mesh or clock tree of a complex electronic circuit. The duty cycle correction device may, beside other components, comprise a duty cycle correction circuit.

The term "duty cycle" may denote a percentage of time during which a signal may have the logical level "1" during one part of a cycle. The remaining time of the cycle the signal may have logical level "0". Thus, a duty cycle of 30% has a "0" time to "1" time ratio that equals 7:3.

The term "duty cycle correction circuit" may denote an electronic circuit designed to correct the duty cycle according to a specification and in line with predefined timing requirements. It may be a component of the duty cycle correction device.

The term "programmable delay circuit" may denote an electronic circuit designed to delay a rising edge or a falling edge, or both of a digital signal with a programmable or adjustable delay. The delay may be controllable by a delay control signal or a configuration signal.

Figure 1:
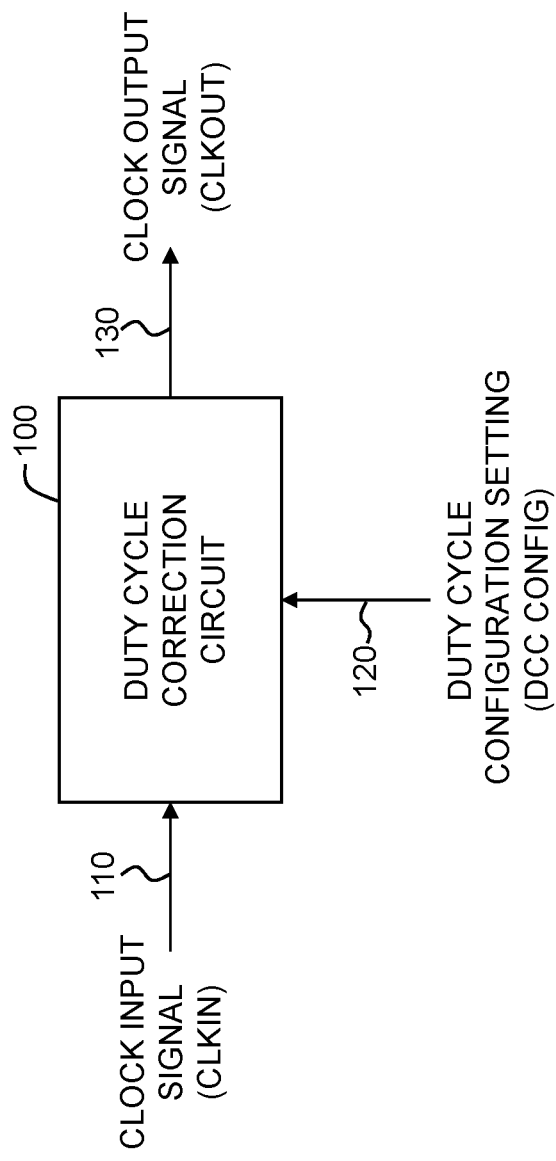
FIG. 1 is a diagram illustrating a duty cycle correction (DCC) circuit.

FIG. 1 is a diagram illustrating duty cycle correction (DCC) circuit 100. Clock input signal (clkin) 110 is fed to duty cycle correction (DCC) circuit 100. Duty cycle configuration setting (dcc config) 120 defines a target duty cycle ratio. Duty cycle correction (DCC) circuit 100 corrects clock input signal (clkin) 110, according to duty cycle configuration setting (dcc config) 120. The output of duty cycle correction (DCC) circuit 100 is clock output signal (clkout) 130. For example, it is assumed that the range of values of duty cycle configuration setting (dcc config) 120 is [−127, 127]. It is assumed that the duty cycle of the input clock signal is 50%. Negative values of duty cycle configuration setting (dcc config) 120 result in duty cycles less than 50%, i.e., the amount of time the output signal is '1' is smaller than the amount of time the output signal is '0'. Positive values of duty cycle configuration setting (dcc config) 120 result in duty cycles greater than 50%, i.e., the amount of time the output signal is '1' is larger than the amount of time the output signal is '0'.

Figure 2:
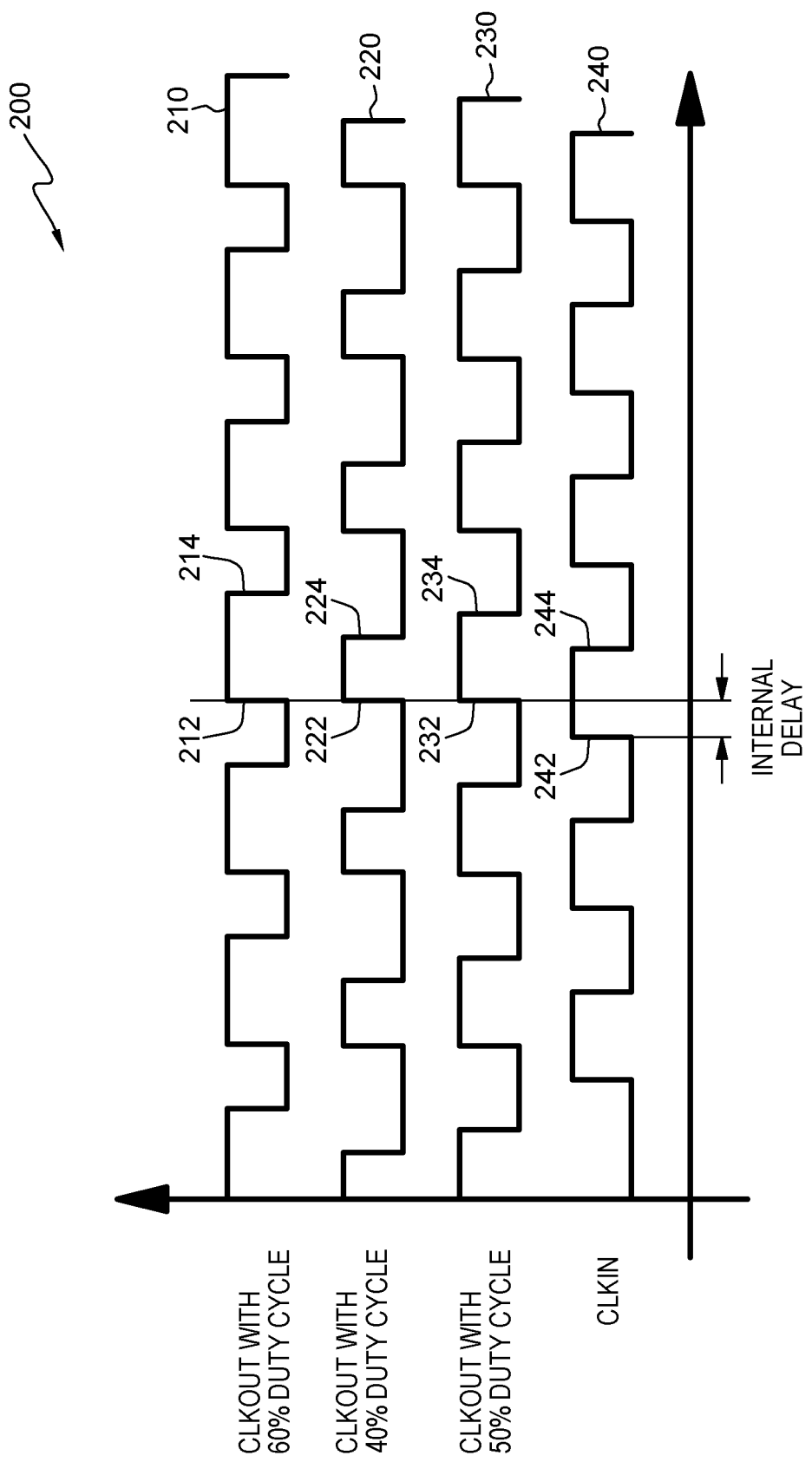
FIG. 2 is a diagram illustrating ideal output waveforms of a duty cycle correction (DCC) circuit.

FIG. 2 is a diagram illustrating ideal output waveforms 200 of a duty cycle correction (DCC) circuit. Embodiments of the present invention disclose approaches to achieve the waveforms shown in FIG. 2. Waveform 210 is a waveform of a clock output signal (clkout) with a 60% duty cycle. Waveform 220 is a waveform of a clock output signal (clkout) with a 40% duty cycle. Waveform 230 is a waveform of a clock output signal (clkout) with a 50% duty cycle. Waveform 240 is a waveform of a clock input signal (clkin). Active clock edge 212 is one of active clock edges of waveform 210; inactive clock edge 214 is one of inactive clock edges of waveform 210. Active clock edge 222 is one of active clock edges of waveform 220; inactive clock edge 224 is one of inactive clock edges of waveform 220. Active clock edge 232 is one of active clock edges of waveform 230; inactive clock edge 234 is one of inactive clock edges of waveform 230. Active clock edge 242 is one of active clock edges of waveform 240; inactive clock edge 244 is one of inactive clock edges of waveform 240. As shown in FIG. 2, the duty cycle correction (DCC) circuit has an internal delay. The internal delay is inherent, no matter what the duty cycle configuration setting (dcc config) is. As shown in FIG. 2, the active clock edges are left untouched, while the inactive clock edges moves to the left for smaller duty cycle values (e.g., 40% duty cycle) and to the right for larger duty cycle values (e.g., 60% duty cycle).

Figure 3:
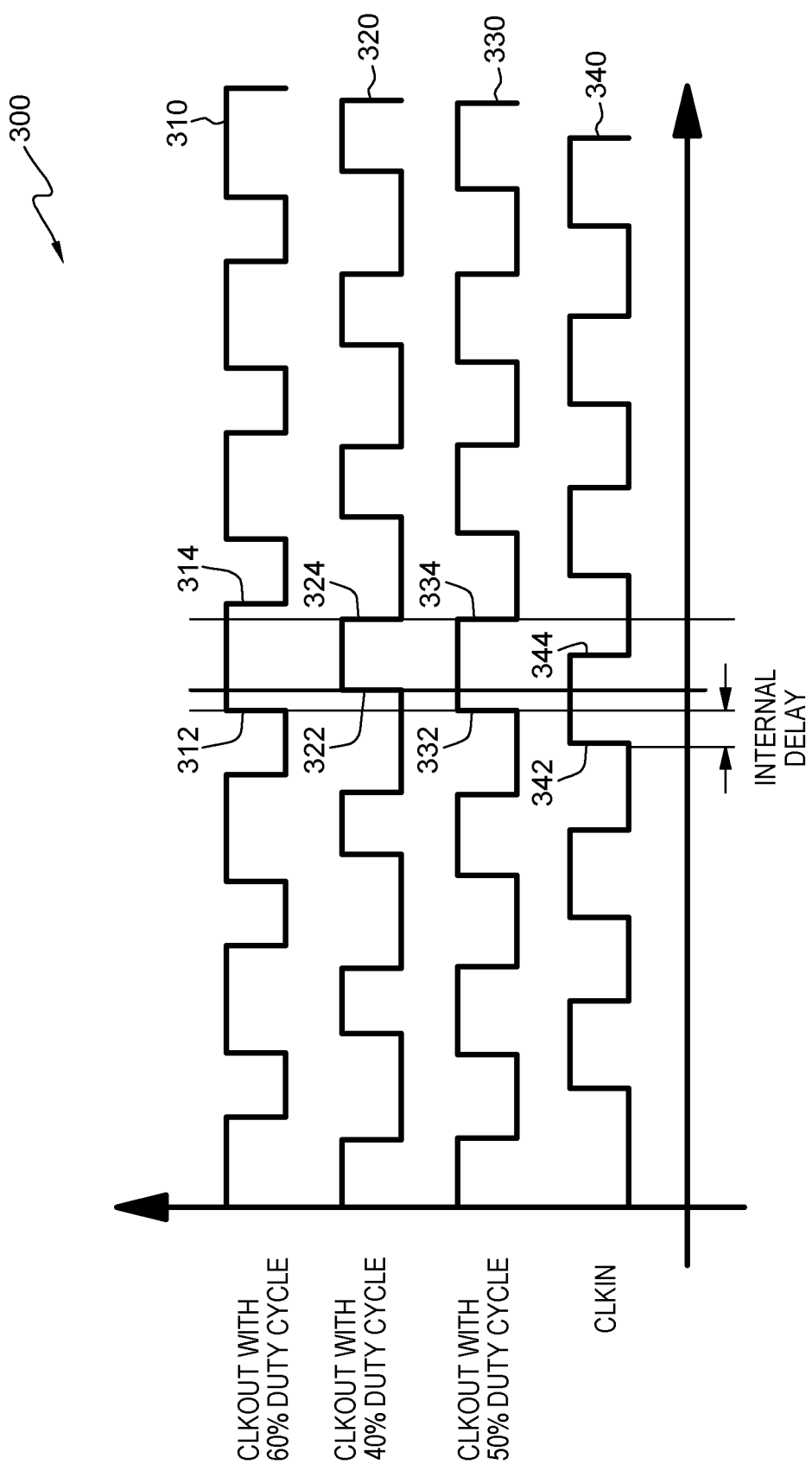
FIG. 3 is a diagram illustrating real output waveforms of a duty cycle correction (DCC) circuit.

FIG. 3 is a diagram illustrating real output waveforms 300 of a duty cycle correction (DCC) circuit. FIG. 3 shows the waveforms of a standard unmodified duty cycle corrections circuit. Waveform 310 is a waveform of a clock output signal (clkout) with a 60% duty cycle. Waveform 320 is a waveform of a clock output signal (clkout) with a 40% duty cycle. Waveform 330 is a waveform of a clock output signal (clkout) with a 50% duty cycle. Waveform 340 is a waveform of a clock input signal (clkin). Active clock edge 312 is one of active clock edges of waveform 310; inactive clock edge 314 is one of inactive clock edges of waveform 310. Active clock edge 322 is one of active clock edges of waveform 320; inactive clock edge 324 is one of inactive clock edges of waveform 320. Active clock edge 332 is one of active clock edges of waveform 330; inactive clock edge 334 is one of inactive clock edges of waveform 330. Active clock edge 342 is one of active clock edges of waveform 340; inactive clock edge 344 is one of inactive clock edges of waveform 340. FIG. 3 shows that the internal delay still exists. As shown in FIG. 3, for a negative value of the duty cycle configuration setting (dcc config), an active clock edge of a waveform is shifted; for example, active clock edge 322 of waveform 320 for a clock output signal (clkout) with a 40% duty cycle is shifted or delayed. As shown in FIG. 3, for a positive value of the duty cycle configuration setting (dcc config), an inactive clock edge of a waveform is shifted; for example, inactive clock edge 314 of waveform 310 for a clock output signal (clkout) with a 60% duty cycle is shifted.

Figure 4:
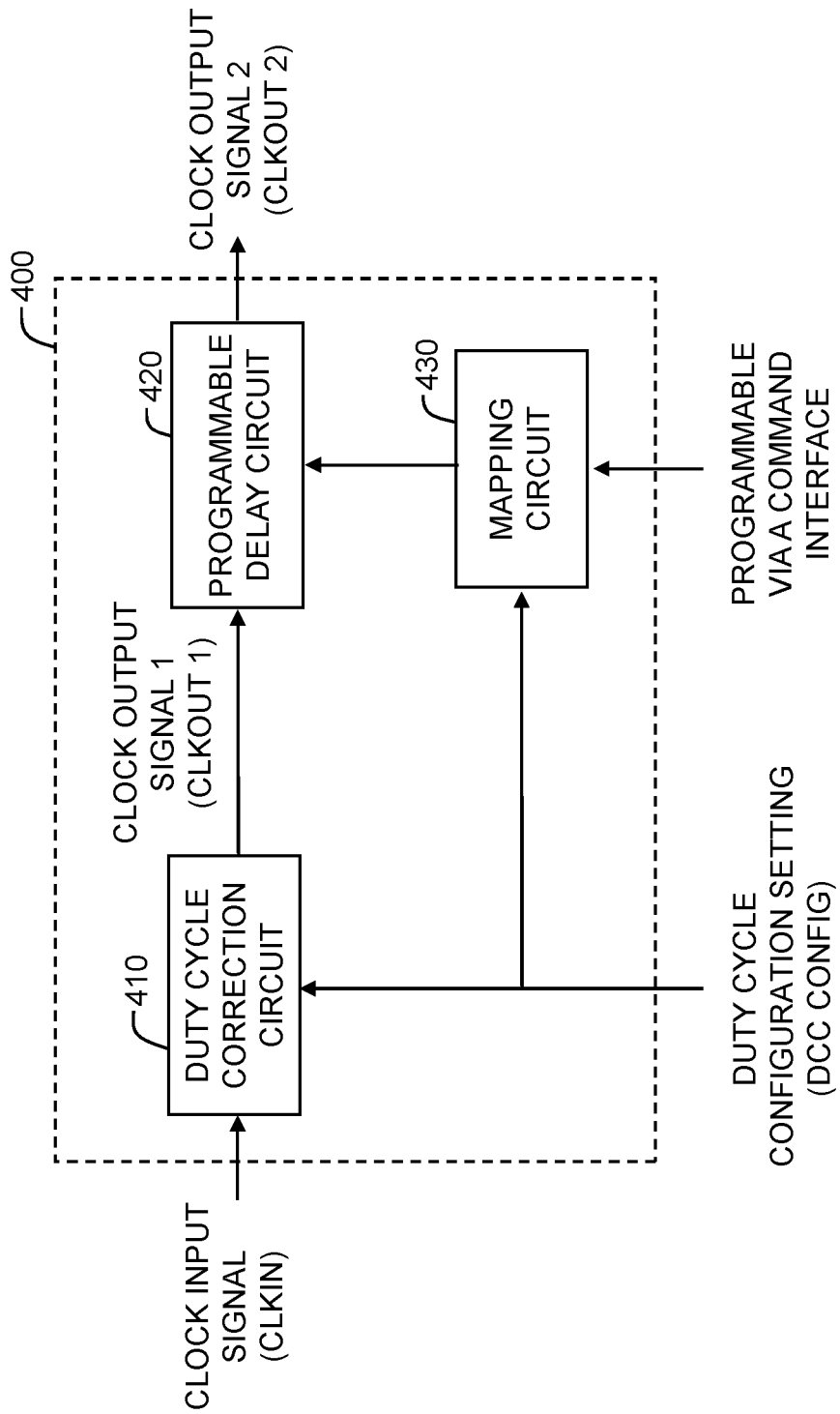
FIG. 4 is a diagram illustrating a duty cycle correction device for static compensation of an active clock edge shift in a clock output signal of a duty cycle correction (DCC) circuit, in accordance with an embodiment of the present invention.

FIG. 4 is a diagram illustrating duty cycle correction device 400 for static compensation of an active clock edge shift in a clock output signal of a duty cycle correction (DCC) circuit, in accordance with an embodiment of the present invention. Duty cycle correction device 400 comprises duty cycle correction (DCC) circuit 410, programmable delay circuit 420, and mapping circuit 430.

The clock input signal (clkin) is fed to duty cycle correction (DCC) circuit 410. The duty cycle configuration setting (dcc config) or the first control signal of duty cycle correction device 400 defines a target duty cycle ratio. Duty cycle correction (DCC) circuit 410 corrects the clock input signal (clkin), according to the duty cycle configuration setting (dcc config) or the first control signal. The output of duty cycle correction (DCC) circuit 410 is the clock output signal 1 (clkout 1). The clock output signal 1 (clkout 1) has shifted clock edges of waveforms; for example, as shown in FIG. 3, the active clock edge of waveform for a clock output signal (clkout) with a 40% duty cycle is shifted.

Programmable delay circuit 420 compensates the shift of an active clock edge in the clock output signal 1 (clkout 1) by delaying the clock output signal 1 (clkout 1) by a predetermined amount of time. The predetermined amount of time is a delay value provided by mapping circuit 430. The output of programmable delay circuit 420 is the clock output signal 2 (clkout 2) shown in FIG. 4. Examples of the clock output signal 2 (clkout 2) will be presented in FIG. 7 and discussed later in this document.

Mapping circuit 430 generates a delay value or a second control signal of duty cycle correction device 400, by mapping a digital value of the duty cycle configuration setting (dcc config) or the first control signal and a digital value of the delay value or the second control signal. The mapping of the first value and the second value will be discussed later in this document with reference to FIG. 6. Mapping circuit 430 transforms the duty cycle configuration setting (dcc config) to the delay value. Programmable delay circuit 420 uses the delay value or the second control signal to compensate the shift of the active clock edge in the clock output signal 1 (clkout 1).

Mapping circuit 430 is programmable via a command interface during a boot or bring-up of a processor. Mapping circuit 430 is also programmable via a command interface during an operation of a processor.

Figure 5:
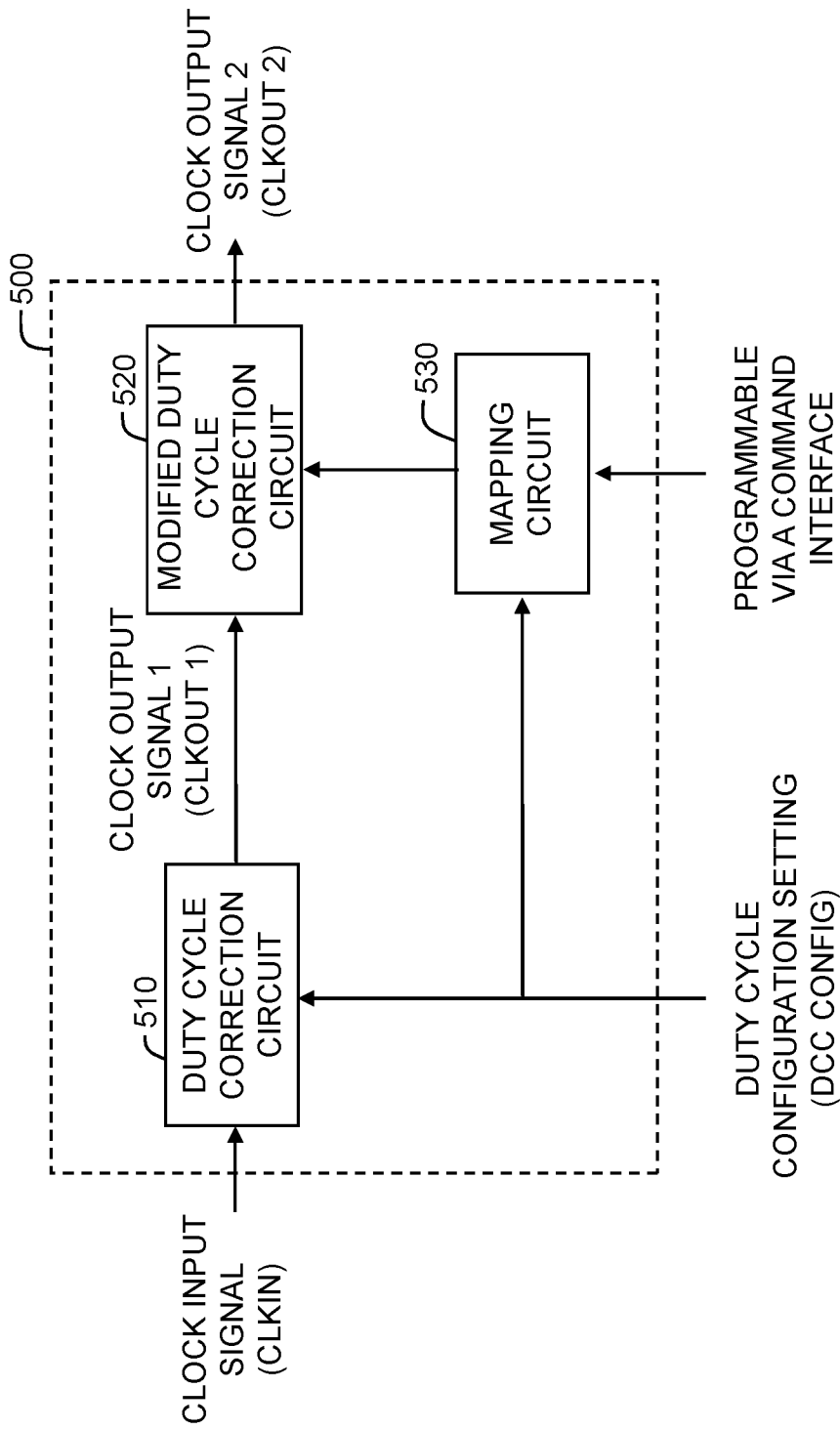
FIG. 5 is a diagram illustrating a duty cycle correction device for static compensation of an active clock edge shift in a clock output signal of a duty cycle correction (DCC) circuit, in accordance with another embodiment of the present invention.

FIG. 5 is a diagram illustrating duty cycle correction device 500 for static compensation of an active clock edge shift in a clock output signal of a duty cycle correction (DCC) circuit, in accordance with another embodiment of the present invention. Duty cycle correction device 500 comprises duty cycle correction (DCC) circuit 510, modified duty cycle correction (DCC) circuit 520, and mapping circuit 530. Same as duty cycle correction (DCC) circuit 410 shown in FIG. 4, duty cycle correction (DCC) circuit 510 corrects the clock input signal (clkin), according to the duty cycle configuration setting (dcc config) or the first control signal. Same as mapping circuit 430 shown in FIG. 4, mapping circuit 530 generates the delay value or the second control signal by mapping the digital value of the duty cycle configuration setting (dcc config) or the first control signal and the digital value of the delay value or the second control signal.

In duty cycle correction device 500, modified duty cycle correction (DCC) circuit 520 compensates the shift of an active clock edge in the clock output signal 1 (clkout 1) by delaying the clock output signal 1 (clkout 1) by a predetermined amount of time. Modified duty cycle correction (DCC) circuit 520 uses the delay value or the second control signal, which is generated by mapping circuit 530, to compensate the shift of the active clock edge in the clock output signal 1 (clkout 1).

Programmable delay circuit 420 shown in FIG. 4 and modified duty cycle correction (DCC) circuit 520 shown in FIG. 5 are different circuits. However, they may not track different operating conditions (e.g., voltage and temperature). Modified duty cycle correction (DCC) circuit 520 uses the same structure as duty cycle correction (DCC) circuit 510; however, modified duty cycle correction (DCC) circuit 520 is programmed to compensates the shift of the active clock edges in the clock output signal 1 (clkout 1). Modified duty cycle correction (DCC) circuit 520 uses the same transistors for the clock path; therefore, modified duty cycle correction (DCC) circuit 520 may track the delay or the active clock edge shift better than programmable delay circuit 420 shown in FIG. 4. It may be advantageous to create a new circuit, such as modified duty cycle correction (DCC) circuit 520, based on a duty cycle correction (DCC) circuit such as duty cycle correction (DCC) circuit 510.

Figure 6:
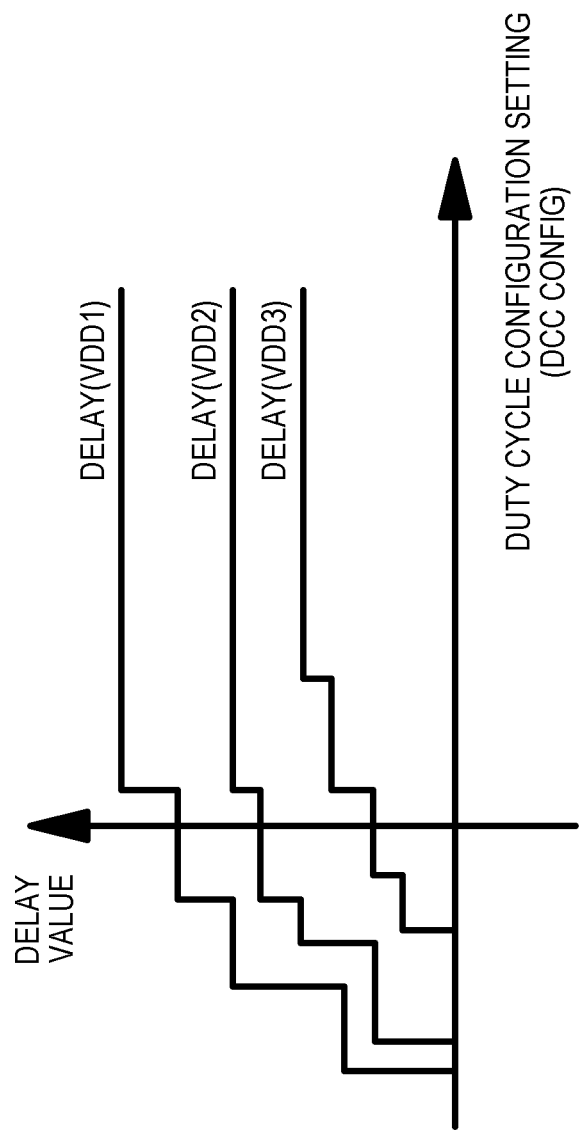
FIG. 6 is a diagram illustrating duty cycle configuration settings (dcc config) versus delay values, in accordance with an embodiment of the present invention.

FIG. 6 is a diagram illustrating the duty cycle configuration settings (dcc config) versus delay values, in accordance with an embodiment of the present invention. FIG. 6 shows examples of delay values (or the second control signals) corresponding to different duty cycle configuration settings (dcc config) (or the first control signals) at different voltages (such as VDD1, VDD2, and VDD3). In FIG. 6, the horizontal axis represents the duty cycle configuration settings (dcc config) (or the first control signals) while the vertical axis represents the delay values (or the second control signals). As mentioned earlier, negative values of duty cycle configuration setting (dcc config) result in duty cycles less than 50%, while positive values of duty cycle configuration setting (dcc config) result in duty cycles greater than 50%. It is shown in FIG. 6 that different delay values correspond different duty cycle configuration settings (dcc config) respectively. As discussed earlier in this document, mapping circuit 430 shown in FIG. 4 or mapping circuit 530 shown in FIG. 5 maps a delay value to a duty cycle configuration setting (dcc config).

Figure 7:
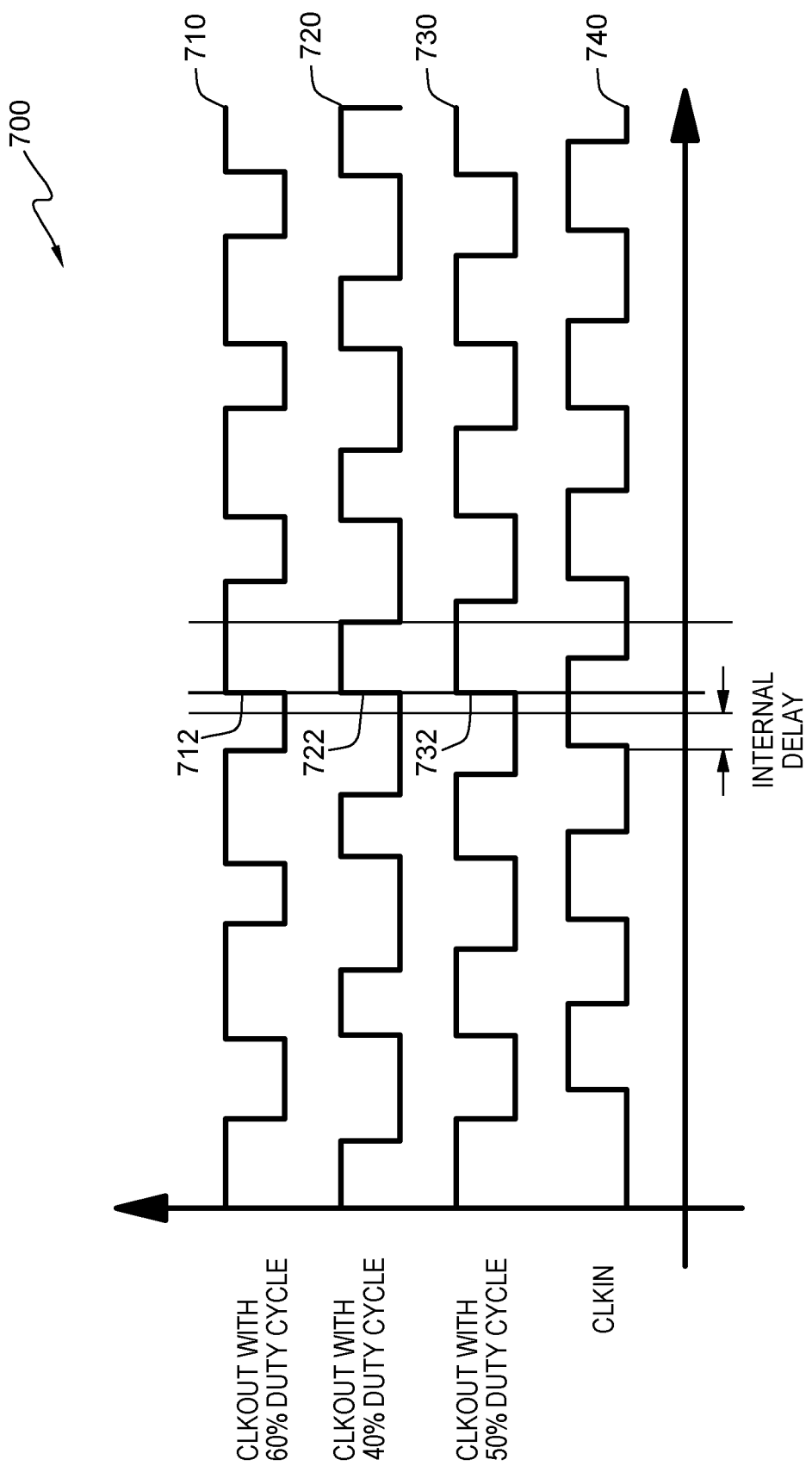
FIG. 7 is a diagram illustrating waveforms of a clock output signal of the duty cycle correction device shown in FIG. 4 or FIG. 5, in accordance with an embodiment of the present invention.

FIG. 7 is a diagram illustrating waveforms 700 of a clock output signal of duty cycle correction device 400 shown in FIG. 4 or duty cycle correction device 500 shown in FIG. 5, in accordance with an embodiment of the present invention. As discussed earlier in this document, programmable delay circuit 420 shown in FIG. 4 or modified duty cycle correction (DCC) circuit 520 shown in FIG. 5 compensates the shift of an active clock edge in the clock output signal 1 (clkout 1) by delaying the clock output signal 1 (clkout 1) according to a delay value (or the second control signal). The compensation of the shift of the active clock edge in the clock output signal 1 (clkout 1) by programmable delay circuit 420 or modified duty cycle correction (DCC) circuit 520 results in output waveforms 700 in the clock output signal 2 (clkout 2) of duty cycle correction device 400 or duty cycle correction device 500.

Referring to FIG. 7, output waveforms 700 are examples of the clock output signal 2 (clkout 2). Waveform 710 is a waveform after the compensation for a 60% duty cycle. Waveform 720 is a waveform after the compensation for a 40% duty cycle. Waveform 730 is a waveform after the compensation for a 50% duty cycle. Waveform 740 is a waveform of a clock input signal (clkin).

Programmable delay circuit 420 shown in FIG. 4 or modified duty cycle correction (DCC) circuit 520 shown in FIG. 5 compensates the active clock edge shift shown in FIG. 3. Programmable delay circuit 420 or modified duty cycle correction (DCC) circuit 520 delays clock edge 312 of waveform 310 (shown in FIG. 3) and delays active clock edges 332 of waveform 330 (shown in FIG. 3). The results of the compensation are shown by output waveforms 700. Through the compensation, active clock edges 712 of waveform 710 for a 60% duty cycle and active clock edge 732 of waveform 730 for a 50% duty cycle are delayed to align with active clock edges 722 of waveform 720 for a 40% duty cycle.

Figure 8:
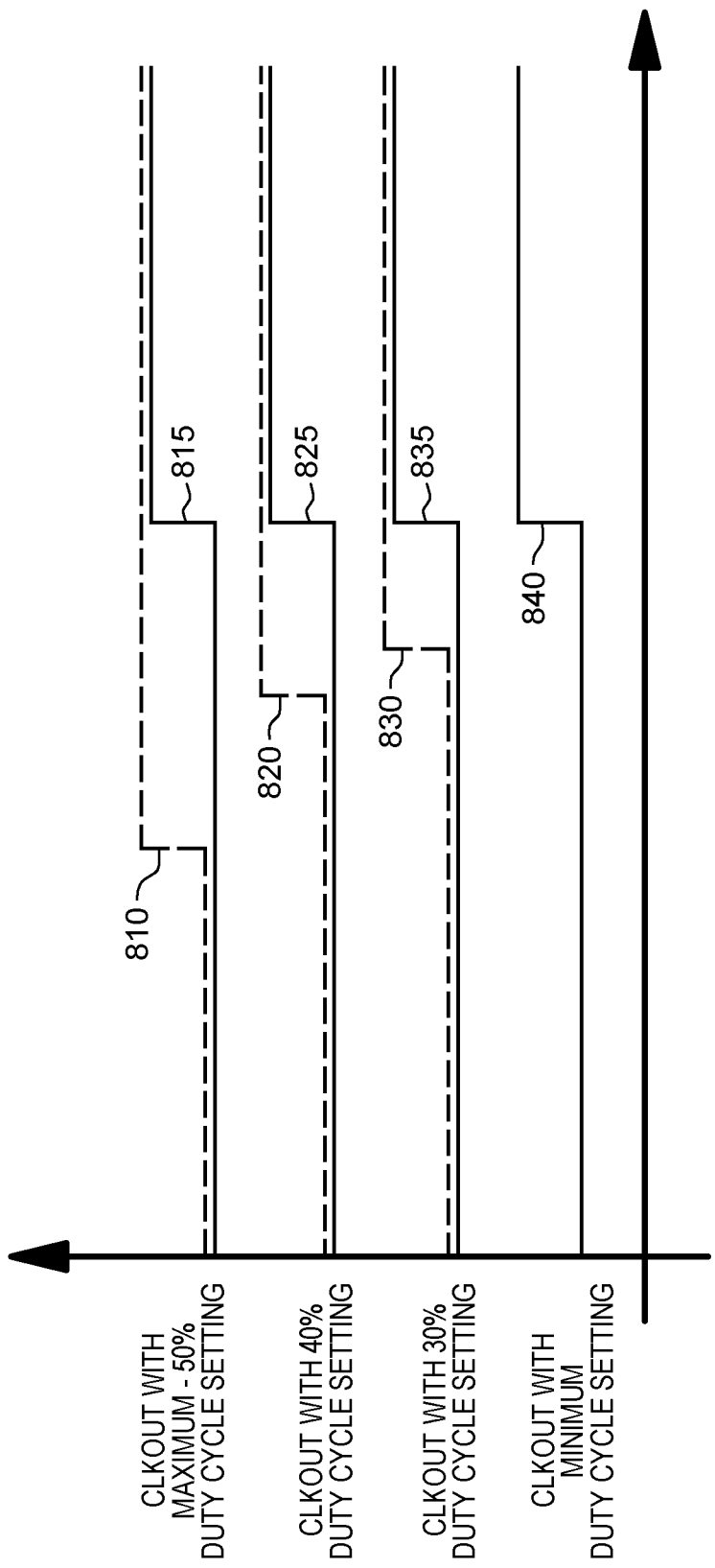
FIG. 8 is a diagram illustrating compensation delays necessary to align active clock edges for different duty cycle configuration settings (dcc config), in accordance with an embodiment of the present invention.

FIG. 8 is a diagram illustrating compensation delays necessary to align active clock edges for different duty cycle configuration settings (dcc config), in accordance with an embodiment of the present invention. Active clock edges 810, 820, and 830 are active clock edges before the compensation delays. Active clock edge 810 is an active clock edge of a waveform for a clock output signal (clkout) with a 50% duty cycle. Active clock edge 820 is an active clock edge of a waveform for a clock output signal (clkout) with a 40% duty cycle. Active clock edge 830 is an active clock edge of a waveform for a clock output signal (clkout) with a 30% duty cycle. Active clock edge 840 is an active clock edge of a waveform for a clock output signal (clkout) with a minimum duty cycle. As shown in FIG. 8, an active clock edge shift (or delay) in the output of a duty cycle correction (DCC) circuit generally depends on the duty cycle configuration setting (dcc config). A lower duty cycle configuration setting (dcc config) causes a greater active clock edge shift (or delay), while a higher duty cycle configuration setting (dcc config) causes a smaller active clock edge shift (or delay). For example, an active clock edge shift (or delay) due to a 30% duty cycle is greater than an active clock edge shift (or delay) due to 40%, and an active clock edge shift (or delay) due to a 40% duty cycle is greater than an active clock edge shift (or delay) due to 50%.

Referring to FIG. 8, active clock edges 815, 825, and 835 are active clock edges after the compensation delays. After the compensation delay, active clock edges 815, 825, and 835 are aligned to active clock edge 840 (which is an active clock edge of a waveform for a clock output signal (clkout) with a minimum duty cycle). Active clock edge 815 is an active clock edge of a waveform after the compensation for a 50% duty cycle. Active clock edge 825 is an active clock edge of a waveform after the compensation for a 40% duty cycle. Active clock edge 835 is an active clock edge of a waveform after the compensation for a 30% duty cycle. It is shown in FIG. 8 that a greater compensation delay is needed for a higher duty cycle configuration setting (dcc config) such as 50% duty cycle. It is also shown in FIG. 8 that a less compensation delay is needed for a lower duty cycle configuration setting (dcc config) such as 30% duty cycle.

Figure 9:
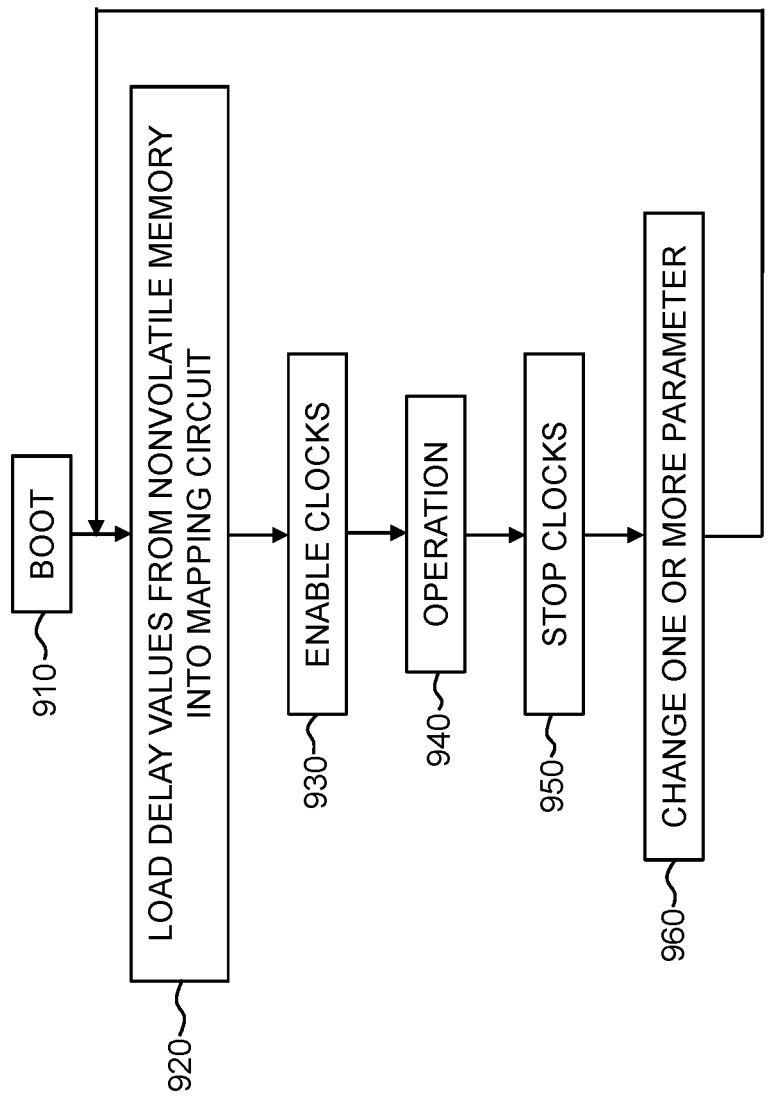
FIG. 9 is a diagram illustrating steps of changing delay values when changing operational parameters, in accordance with an embodiment of the present invention.

FIG. 9 is a diagram illustrating steps of changing delay values when changing operational parameters, in accordance with an embodiment of the present invention. When a processor is booted (step 910), delay values for compensation of active clock edge shifts are loaded from nonvolatile memory into a mapping circuit (such as mapping circuit 430 or 530) (step 920). Then, clocks of the processor are enabled (step 930), the processor operates (step 940), and the clocks are stopped (step 950). When parameters (such as operating frequency, supply voltage, etc.) are changed (step 960), the delay values for compensation of active clock edge shifts are loaded from nonvolatile memory into a mapping circuit (such as mapping circuit 430 or 530) (step 920). The parameters may be changed even during operation without stopping the clocks.

The delay values can be retrieved by measurement of skew during chip characterization for each chip individually or depending upon process characteristics (i.e. slow, medium, and fast). The delay values may be stored within nonvolatile memory and applied to the mapping circuit (such as mapping circuit 430 or 530) as needed, i.e., during boot or during operation when parameters (such as operating frequency, supply voltage, etc.) are changed.

Based on the foregoing, a duty cycle correction device and a method have been disclosed for static compensation of an active clock edge shift for a duty cycle correction circuit. However, numerous modifications and substitutions can be made without deviating from the spirit and scope of the present invention. Therefore, the present invention has been disclosed by way of examples and not limitation.

What is claimed is:

1. A method comprising:
   receiving a duty cycle configuration setting;
   defining a target duty cycle ratio based on the duty cycle configuration setting;
   correcting, by a duty cycle correction circuit in a duty cycle correction device, a clock input signal according to the configuration setting to create a first clock output signal;
   mapping, by a mapping circuit in the duty cycle correction device, a delay value for compensation of a first active clock edge in a first control signal and a second control signal,
   wherein the mapping circuit comprises a non-volatile memory;
   loading the delay value from the non-volatile memory into the mapping circuit; and
   compensating, by a programmable delay circuit in the duty cycle correction device, for a shift of an active clock edge in the first clock output signal by delaying the first clock output signal by the delay value to produce a second clock output signal.

2. The method of claim 1, wherein the delay value is based on the duty cycle configuration setting.

3. The method of claim 2, wherein the duty value is above 50% when the duty cycle configuration setting is negative.

4. The method of claim 2, wherein the duty value is below 50% when the duty cycle configuration setting is positive.

5. The method of claim 1, wherein the mapping circuit is programmable via a command interface during a boot and an operation of a processor.

6. The method of claim 1, wherein the first control signal is the duty cycle configuration setting.

7. The method of claim 1, wherein the second control signal is a second delay value, wherein a programmable delay circuit delays the first clock output signal of the duty cycle correction circuit according to the second delay value.

8. The method of claim 7, wherein the second delay value is determined during characterization of a chip and depends on process characterization.

9. The method of claim 7, wherein the second delay value is stored in nonvolatile memory and is applied to the mapping circuit during a boot of a processor and during operation when one or more parameters are changed.

10. The method of claim 1, wherein the mapping circuit is configured to generate the second control signal that corresponds to the first control signal by mapping a digital value of the first control signal and a digital value of the second control signal.

11. The method of claim 8, wherein the second delay value is retrieved by measurement of skew during chip characterization for each chip individually.

12. The method of claim 11, wherein the second delay values is stored within nonvolatile memory and applied to the mapping circuit on demand.

* * * * *